United States Patent
Lee

(10) Patent No.: US 9,491,855 B2
(45) Date of Patent: Nov. 8, 2016

(54) DISPLAY DEVICE

(71) Applicant: SAMSUNG DISPLAY CO., LTD., Yongin, Gyeonggi-Do (KR)

(72) Inventor: Hee-Kwon Lee, Asan-si (KR)

( * ) Notice: Subject to any disclaimer, the term of this patent is extended or adjusted under 35 U.S.C. 154(b) by 43 days.

(21) Appl. No.: 14/667,956

(22) Filed: Mar. 25, 2015

(65) Prior Publication Data

US 2016/0105951 A1 Apr. 14, 2016

(30) Foreign Application Priority Data

Oct. 14, 2014 (KR) .................. 10-2014-0138486

(51) Int. Cl.
*H05K 9/00* (2006.01)
*H05K 1/02* (2006.01)
*H05K 1/11* (2006.01)

(52) U.S. Cl.
CPC .............. *H05K 1/028* (2013.01); *H05K 1/111* (2013.01); *H05K 9/0067* (2013.01); *H05K 2201/10128* (2013.01)

(58) Field of Classification Search
CPC . H05K 1/0219; H05K 9/0067; H05K 1/0259
See application file for complete search history.

(56) References Cited

U.S. PATENT DOCUMENTS

| | | | | |
|---|---|---|---|---|
| 5,412,495 A * | 5/1995 | Kim | ................ | G02F 1/133345 349/40 |
| 7,782,411 B2 * | 8/2010 | Shie | ................ | G02F 1/13452 349/139 |
| 7,859,633 B2 * | 12/2010 | Park | ................ | G02F 1/13452 349/149 |
| 8,049,410 B2 * | 11/2011 | Suh | ................ | H01L 27/3276 257/79 |
| 8,068,082 B2 * | 11/2011 | Cho | ................ | G09G 3/20 345/98 |
| 8,599,328 B2 * | 12/2013 | Jang | ................ | G02F 1/133308 349/58 |
| 8,995,102 B2 * | 3/2015 | Lu | ................ | H02H 3/20 361/212 |
| 2004/0185284 A1 * | 9/2004 | Ho | ................ | H01B 1/122 428/500 |
| 2007/0236910 A1 * | 10/2007 | Yun | ................ | G02F 1/133308 362/23.18 |
| 2008/0246744 A1 * | 10/2008 | Park | ................ | G06F 3/0416 345/173 |
| 2011/0096456 A1 * | 4/2011 | Kim | ................ | H04N 5/2252 361/220 |
| 2011/0279750 A1 * | 11/2011 | Jeong | ................ | G02F 1/133615 349/61 |
| 2012/0146863 A1 * | 6/2012 | Kwon | ................ | H01Q 1/243 343/720 |
| 2012/0169680 A1 * | 7/2012 | Yano | ................ | G02F 1/1345 345/204 |
| 2014/0001966 A1 * | 1/2014 | Cho | ................ | H05B 37/00 315/161 |
| 2015/0230331 A1 * | 8/2015 | Lee | ................ | H05K 1/0259 361/220 |
| 2015/0382446 A1 * | 12/2015 | Kwon | ................ | H05K 1/028 174/251 |
| 2016/0155408 A1 * | 6/2016 | Lee | ................ | G02F 1/136204 345/211 |

FOREIGN PATENT DOCUMENTS

| | | | |
|---|---|---|---|
| KR | 10-2006-0125074 A | | 12/2006 |
| KR | 10-2008-0035784 A | | 4/2008 |
| KR | 10-2008-0098145 A | | 11/2008 |
| KR | 20080097778 A | * | 11/2008 |
| KR | 10-2012-0063652 A | | 6/2012 |

* cited by examiner

*Primary Examiner* — Jeremy C Norris
*Assistant Examiner* — Nathan Milakovich

(57) ABSTRACT

A display device, including a display panel; a flexible printed circuit board (FPCB) including a driving integrated circuit (IC) and attached to a rear surface of the display panel; a conductive member at the rear surface of the display panel; an FPCB connection pad connected to the conductive member at the rear surface of the display panel and connected to the FPCB; an FPCB connection terminal connected to the FPCB connection pad and at the FPCB; and a ground at the FPCB.

14 Claims, 5 Drawing Sheets

DISPLAY DEVICE

CROSS-REFERENCE TO RELATED APPLICATION

Korean Patent Application No. 10-2014-0138486, filed on Oct. 14, 2014, in the Korean Intellectual Property Office, and entitled: "Display Device," is incorporated by reference herein in its entirety.

BACKGROUND

1. Field

The described technology relates to a display device.

2. Description of the Related Art

Flat panel displays include liquid crystal displays (LCDs), plasma display devices (PDPs), organic light emitting devices (OLEDs), electric field effect displays (FEDs), and electrophoretic display (EPDs).

SUMMARY

Embodiments may be realized by providing a display device, including a display panel; a flexible printed circuit board (FPCB) including a driving integrated circuit (IC) and attached to a rear surface of the display panel; a conductive member at the rear surface of the display panel, the conductive member absorbing and transmitting static electricity generated in the display panel; an FPCB connection pad connected to the conductive member at the rear surface of the display panel and connected to the FPCB; and an FPCB connection terminal connected to the FPCB connection pad and at the FPCB, the FPCB connection terminal transmitting transmitted static electricity to a ground at the FPCB.

The conductive member may be at a circumferential edge of the display panel.

The conductive member may be a loop shape that is symmetrically divided into two portions.

The conductive member may include a plurality of disconnected sections. \

The sections may be separated by about 50 micrometers (μm) to 100 micrometers (μm).

The conductive member may be on a functional tape attached to the rear surface of the display panel.

The functional tape may include an embossed tape attached to the rear surface of the display panel; an adhesion sheet on the embossed tape; and a protection tape on the adhesion sheet.

The conductive member may be formed on a same layer and as one body with the protection tape.

The conductive member may have parallel portions protruding from the functional tape with a gap therebetween.

The conductive member may include a metal material.

The metal material may include stainless steel (SUS), copper (Cu), or silver (Ag).

The display device may include more than one FPCB connection pad.

The display panel may be flexible.

The FPCB may be bent toward the display panel; and the FPCB connection terminal may overlap the FPCB connection pad.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
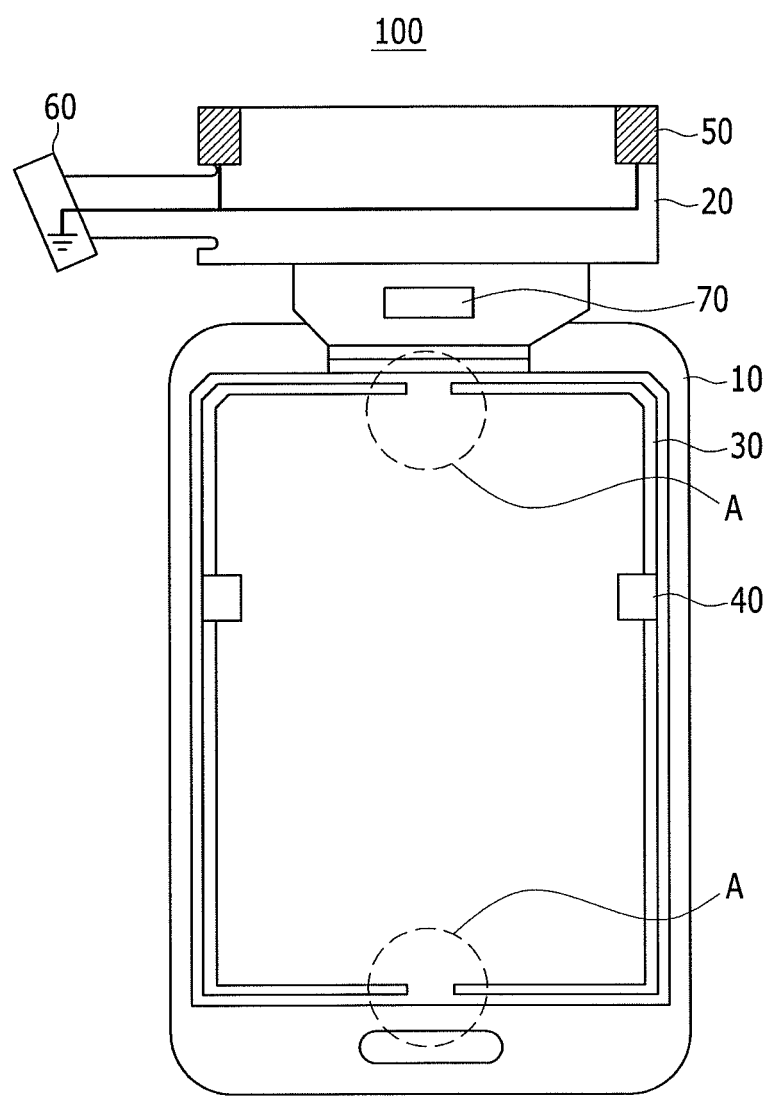
FIG. 1 illustrates a schematic diagram of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The drawings are schematic and not proportionally scaled. Relative scales and ratios in the drawings are enlarged or reduced for the purpose of accuracy and convenience, and the scales are merely illustrative and are not limited thereto. In addition, like reference numerals designate like structures, elements, or parts throughout the specification. It will be understood that when an element is referred to as being "on" or "above" another element, it can be directly on another element or intervening elements may be present therebetween. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Exemplary embodiments described with reference to cross-sectional views represent ideal exemplary embodiments in detail. Therefore, various modifications of diagrams are expected. Accordingly, exemplary embodiments are not limited to specific shapes of shown regions, and for example, also include modifications of the shape by manufacturing.

A display device according to an exemplary embodiment will be described with reference to FIG. 1 and FIG. 2.

Figure 2:
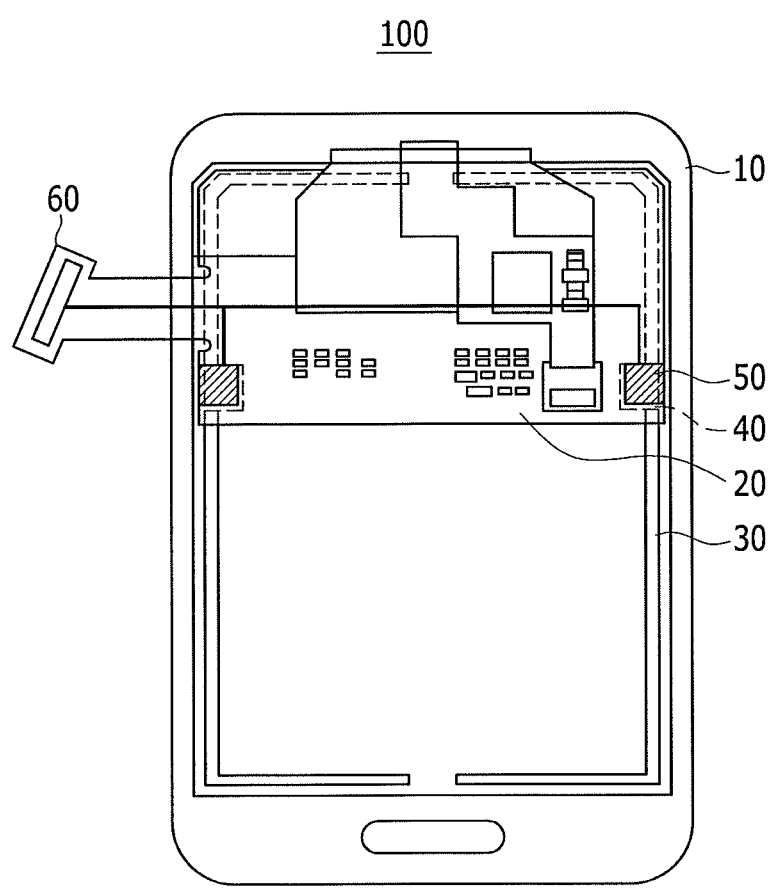
FIG. 2 illustrates a schematic diagram of a shape of a flexible printed circuit board (PCB) (FPCB) of a display device according to an exemplary embodiment connected to a display panel.

FIG. 1 illustrates a schematic diagram of a display device according to an exemplary embodiment, and FIG. 2 illustrates a schematic diagram of a shape of a flexible printed circuit board (PCB) (FPCB) of a display device according to an exemplary embodiment connected to a display panel.

Referring to FIG. 1, a rear surface of a display device 100, e.g., a portable terminal, is schematically shown, and a configuration of an outer case provided outside the display device is omitted. As shown in FIG. 1, the display device 100 may include a display panel 10, a flexible printed circuit board (PCB) (FPCB) 20 attached to a portion of the display panel 10, a conductive member 30 disposed at a circumferential edge of the display panel 10, an FPCB connection pad 40 disposed at an arbitrary position connected to the conductive member 30, and an FPCB connection terminal 50 provided at the FPCB.

The display panel 10 may be an organic light emitting panel and may configure an organic light emitting device. In the case of an organic light emitting panel, the display panel may include a driving circuit and an organic light emitting element formed on the flexible substrate. The flexible substrate may be made of, for example, a flexible plastic material. In an embodiment, the flexible substrate may be formed of a metallic substrate made of stainless steel, or various other flexible materials. The flexible substrate may be formed of a plastic material having excellent heat resistance and durability, such as polyethylene ether phthalate, polyethylene naphthalate, polycarbonate, polyarylate, polyetherimide, polyether sulfone, and polyimide.

The driving circuit unit may include a thin film transistor and may drive the organic light emitting element. The organic light emitting element may be connected to the driving circuit unit to emit light in accordance with a driving signal transmitted from the driving circuit unit to display an image. The organic light emitting element and the driving circuit unit may be formed to have various structures by those skilled in the art.

The FPCB 20 may be mounted with a driving integrated circuit (IC) 70 and may be attached to the portion of the rear surface of the display panel 10. A driving signal to drive the display panel 10 may be supplied from the outside through the FPCB 20, and the supplied driving signal may be converted in the driving IC 70 to be supplied to the display panel 10.

The conductive member 30 may be provided at the rear surface of the display panel 10, and may absorb static electricity generated in the display panel 10 to be transmitted to the FPCB connection pad 40 that will be described.

The conductive member 30 may be disposed at the circumferential edge of the display panel 10. The conductive member 30 may be formed of a symmetrical division loop shape or half loop shape that is linearly bent at the edge portion of the display panel 10. For example, to prevent random irradiation of the static electricity at the outermost area of the display panel 10, while the conductive member 30 is disposed at the circumferential edge of the display panel 10, the conductive member 30 may be formed of a symmetrical two division loop, not one loop shape, to prevent EMI (electromagnetic interference) and to improve EMS (electromagnetic susceptibility). When the conductive member 30 is formed of one loop shape, the conductive member 30 may overlap the antenna, and the antenna performance may be deteriorated. Accordingly, the symmetrical loop shape of the conductive member may form an antenna opening region A.

To transfer the static electricity generated in the display panel to ground 60 of the FPCB 20, the FPCB connection pad 40 connected to the conductive member 30 may be connected with the FPCB connection terminal 50 and the FPCB connection terminal 50 may transmit the static electricity to ground 60 through a conductive line.

The FPCB connection pad 40 may be connected to the conductive member 30 and may be provided at the rear face of the display panel 10 to be connected to the FPCB 20. More than one FPCB connection pad 40 may be formed, and may be provided individually at both sides of an approximately center position of the conductive member 30 at the rear surface of the display panel 10.

As shown in FIG. 2, the FPCB connection terminal 50 may be electrically connected to the FPCB connection pad 40. For example, at the portion in which the FPCB 20 and the display panel 10 are attached, the FPCB 20 may be bent toward the display panel 10 and may have a shape such that the FPCB connection terminal 50 overlaps the FPCB connection pad 40 to be connected while the FPCB 20 is bent. The FPCB connection terminal 50 may be provided at the FPCB 20 such that the static electricity transmitted from the conductive member 30 to the FPCB connection pad 40 is transmitted to the ground 60 provided at the FPCB 20. The FPCB connection terminal 50 may transmit the static electricity to the ground 60 through the conductive line.

The FPCB connection terminal 50 may be provided at a corresponding position as the corresponding FPCB connection pad 40. The FPCB connection pad 40 and the FPCB connection terminal 50 may be formed of the same material as the conductive material of the conductive member.

Figure 3:
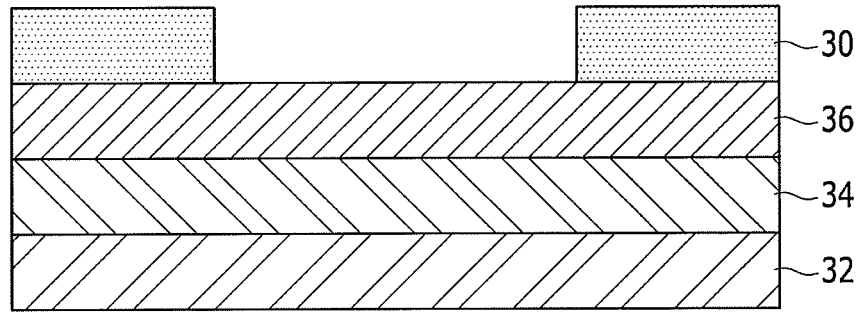
FIG. 3 illustrates a cross-sectional view of an example of a tape deposition structure of a conductive member of a display device according to an exemplary embodiment.

FIG. 3 illustrates a cross-sectional view of an example of a tape deposition structure of a conductive member of a display device according to an exemplary embodiment.

Referring to FIG. 3, the conductive member 30 may be formed with a tape shape. For example, the conductive member 30 may be on functional tapes 32, 34, and 36 attached at the rear surface of the display panel 10.

The functional tapes may include an embossed tape 32, an adhesion sheet 34, and a protection tape 36. The embossed tape 32 may be directly adhered to the rear surface of the display panel 10, and may cushion an impact from the outside of the display device. The adhesion sheet 34 may mutually adhere the embossed tape 32 and the protection tape 36. The adhesion sheet 34 may be provided as a liquid as well as a sheet shape. The protection tape 36 may be on the adhesion sheet 34. The protection tape 36 may protect the display panel 10 and the embossed tape 32 from an external impact and scratch. The conductive member 30 may be on the protection tape 36. The conductive member 30 may be attached with a tape shape or a film shape, e.g., having parallel portions protruding from the functional tape with a gap therebetween, on the protection tape 36 to be disposed at the circumferential edge of the display panel 10.

The conductive member 30 may be formed of a metal material. The metal material may be stainless steel (SUS), copper (Cu), or silver (Ag), or may include a metal material having other conductivities.

Figure 4:
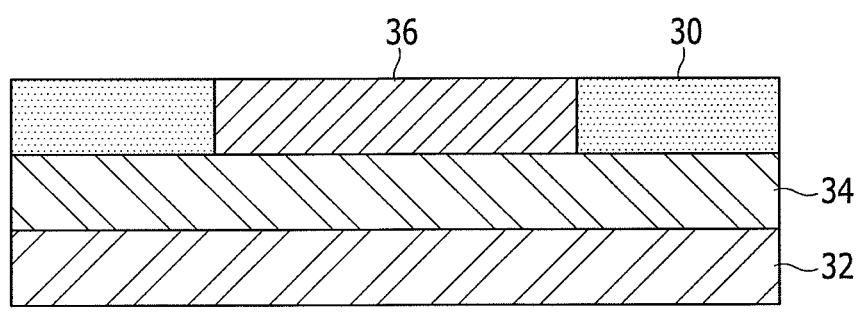
FIG. 4 illustrates a cross-sectional view of another example of a tape deposition structure of a conductive member of a display device according to an exemplary embodiment.

FIG. 4 illustrates a cross-sectional view of another example of a tape deposition structure of a conductive member of a display device according to an exemplary embodiment.

Referring to FIG. 4, the conductive member 30 may be on the adhesion sheet 34 and may be provided as one body with the protection tape 36 at the same phase. Accordingly, the thickness of the tape deposition structure may be reduced compared with a protrusion structure of the exemplary embodiment of FIG. 3 in which the conductive member 30 is provided on the protection tape 36. Like the exemplary embodiment of FIG. 3, the embossed tape 32 may be directly attached to the rear surface of the display panel 10, and the adhesion sheet 34 having the adhesion function may be on the embossed tape 32. The conductive member 30 of the tape shape that is formed as one body with the protection tape 36 may be on the adhesion sheet 34.

On the adhesion sheet 34, the protection tape 36 may be firstly attached at the region except for the region corresponding to the circumferential edge of the display panel in which the conductive member 30 is attached, and then the conductive member 30 may be attached to the region corresponding to the circumferential edge of the display panel, and heights on the cross-section of the protection tape 36 and the conductive member 30 may be the same.

Figure 5:
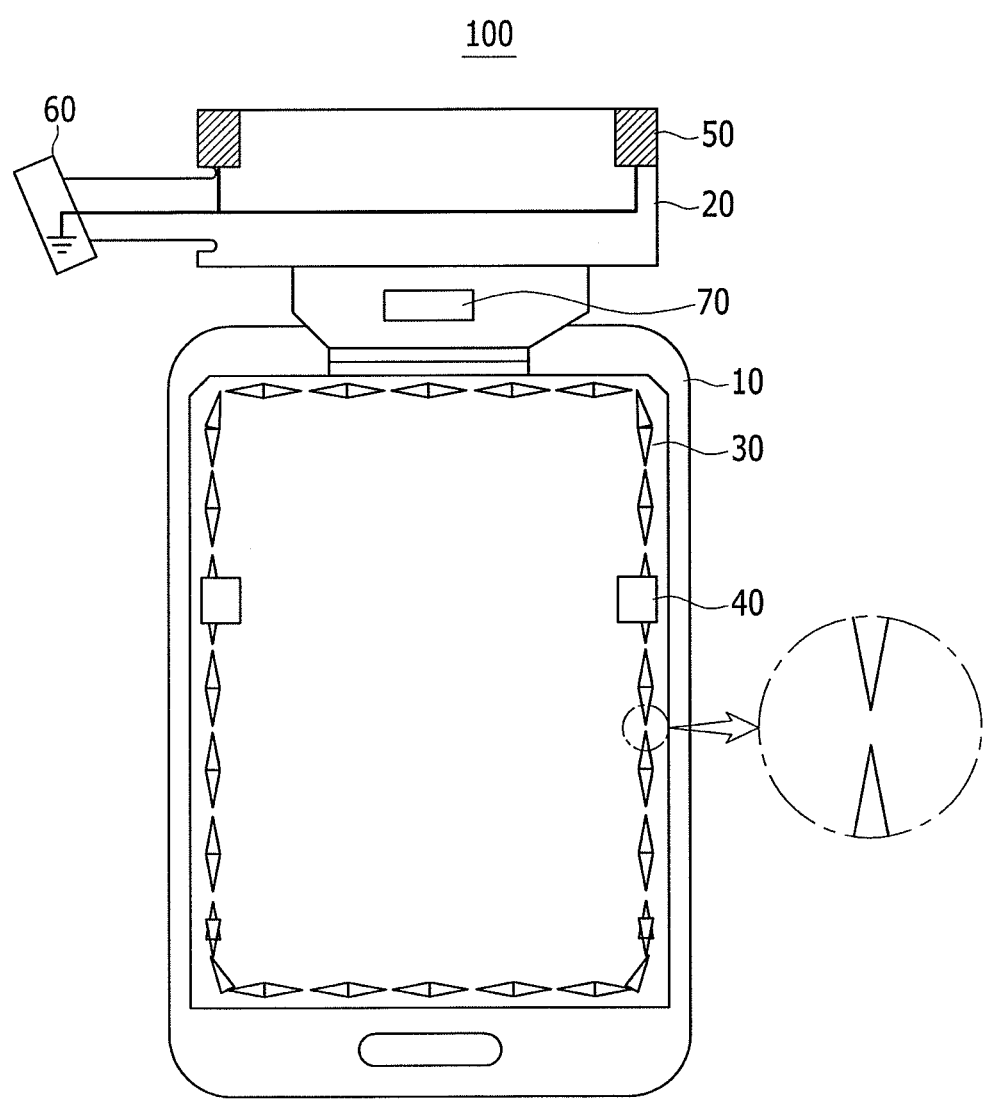
FIG. 5 illustrates a schematic diagram of a display device according to another exemplary embodiment.

FIG. 5 illustrates a schematic diagram of a display device according to another exemplary embodiment.

Referring to FIG. 5, the conductive member 30 may be disposed at the circumferential edge of the display panel 10, and the conductive member 30 may be a structure in which a plurality of disconnected sections are formed. For example, sections of the conductive member 30 may obtain a minute gap for each portion, and a discharge speed of the static electricity may be decreasing before the transmitted static electricity is transmitted to the ground 60 of the FPCB 20. For example, by forming a plurality of disconnected sections, resistance of the sections may be increased and dampened such that the transmission speed of the static electricity may be slowed. In the plurality of disconnected sections, the shape of the conductive member 30 may be a shape in which sharp portions are disposed to face to each other. By forming the conductive member 30 to include predetermined intervals separating the sharp portions, the transmission speed may be slowed while transmitting the static electricity. The plurality of disconnected sections may have an interval of, e.g., may be separated by, about 50 micrometers (μm) to about 100 micrometers (μm).

By way of summation and review, display devices may be subject to disorder or to damage, for example, due to inflow of an electrostatic discharge. Various attempts to enhance resistance against static electricity have been made. Inside the display device, when static electricity is generated, it may be induced through a region where a conductor of the display panel is disposed, or may be randomly discharged in a region without a conductor, and electrical damage may be generated to a driving IC or other circuit elements.

Provided is a display device in which damage to a circuit element by static electricity may be prevented by including a static electricity discharge path by disposing a conductive member with a symmetrical two division loop shape while forming the conductive member at an outermost edge of the display device.

As described above, in the presently disclosed display device, by including a discharge path of static electricity in the display panel of the display device, the circuit element may be prevented from being damaged by static electricity. Although static electricity may be applied in any region of the display device, the static electricity may be induced to be discharged through the FPCB ground, and protection against failure of the display device may be improved as well as reliability of the display device.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a display panel;
   a flexible printed circuit board (FPCB) including a driving integrated circuit (IC) and attached to a rear surface of the display panel;
   a conductive member at the rear surface of the display panel, the conductive member absorbing and transmitting static electricity generated in the display panel;
   an FPCB connection pad connected to the conductive member at the rear surface of the display panel and connected to the FPCB; and
   an FPCB connection terminal connected to the FPCB connection pad and at the FPCB, the FPCB connection terminal transmitting transmitted static electricity to a ground at the FPCB.

2. The display device as claimed in claim 1, wherein the conductive member is at a circumferential edge of the display panel.

3. The display device as claimed in claim 1, wherein the conductive member is a loop shape that is symmetrically divided into two portions.

4. The display device as claimed in claim 1, wherein the conductive member includes a plurality of disconnected sections.

5. The display device as claimed in claim 4, wherein the sections are separated by about 50 micrometers (μm) to 100 micrometers (μm).

6. The display device as claimed in claim 1, wherein the conductive member is on a functional tape attached to the rear surface of the display panel.

7. The display device as claimed in claim 6, wherein the functional tape includes:
   an embossed tape attached to the rear surface of the display panel;
   an adhesion sheet on the embossed tape; and
   a protection tape on the adhesion sheet.

8. The display device as claimed in claim 7, wherein the conductive member is formed on a same layer and as one body with the protection tape.

9. The display device as claimed in claim 6, wherein the conductive member has parallel portions protruding from the functional tape with a gap therebetween.

10. The display device as claimed in claim 1, wherein the conductive member includes a metal material.

11. The display device as claimed in claim 10, wherein the metal material includes stainless steel (SUS), copper (Cu), or silver (Ag).

12. The display device as claimed in claim 1, comprising more than one FPCB connection pad.

13. The display device as claimed in claim 1, wherein the display panel is flexible.

14. The display device as claimed in claim 1, wherein:
   the FPCB is bent toward the display panel; and
   the FPCB connection terminal overlaps the FPCB connection pad.

* * * * *